United States Patent [19]

Gamble et al.

[11] Patent Number: 4,973,514
[45] Date of Patent: Nov. 27, 1990

[54] EMI SHIELDING COMPOSITES

[75] Inventors: Jeffrey Gamble, Midland; Larry D. Yats, Clare, both of Mich.

[73] Assignee: The Dow Chemical Company, Midland, Mich.

[21] Appl. No.: 619,437

[22] Filed: Jun. 11, 1984

[51] Int. Cl.⁵ .............................................. B32B 5/06
[52] U.S. Cl. .................................... 428/297; 428/323; 428/408
[58] Field of Search ...................... 428/297, 323, 408

[56] References Cited

U.S. PATENT DOCUMENTS

| | | | |
|---|---|---|---|
| 4,267,285 | 5/1981 | Broutman | 428/401 |
| 4,378,322 | 3/1983 | Atterbury et al. | 428/402 |
| 4,435,465 | 3/1984 | Ebneth et al. | 428/397 |
| 4,471,015 | 9/1984 | Ebneth et al. | 428/408 |
| 4,500,595 | 2/1985 | Gerteisen et al. | 428/297 |
| 4,643,940 | 2/1987 | Shaw et al. | 428/323 |
| 4,737,407 | 4/1988 | Wycech | 428/323 |

*Primary Examiner*—Stephen J. Lechert, Jr.
*Attorney, Agent, or Firm*—Gary C. Cohn; Dau R. Howard; Thomas A. Ladd

[57] ABSTRACT

A resinous composite material is disclosed containing randomly dispersed fibers and from about 0.05 to 30 percent of a particulate conductive or semi-conductive filler. In addition to providing excellent EMI shielding properties, these composites are formable and are of sufficient strength to act as structural components.

11 Claims, No Drawings

EMI SHIELDING COMPOSITES

BACKGROUND OF THE INVENTION

This invention relates to polymeric composites containing dispersed conductive fibers therein, which are effective, for example, as shields for electromagnetic interference.

Electronic devices, particularly solid state electronic devices such as are found in computers, microprocessors, calculators, watches, radios, televisions, automobile ignition systems, word processors and the like, are often sensitive to electromagnetic interference (EMI). Said EMI is present in the environment from many sources. Most commonly said EMI is emitted by electrical sources or the electronic devices themselves. Radio, television and other communication systems are also sources of EMI. EMI often disrupts the functioning of said electronic devices, causing diminished performance or even total failure of the device. Although normal performance of the electronic device is usually restored upon elimination of the EMI, the temporary failure of the electronic device may be of critical importance. For example, automobile electronic ignition systems have been known to fail due to EMI emitted from another car's spark plugs, ignition system or even from the operation of the car radio. Such failure causes the entire automobile engine to be temporarily inoperative. Similarly, aircraft electronic guidance systems, communications systems, onboard computers and the like are known to be adversely effected even by the playing of portable radios in the aircraft.

To reduce these problems, it is common practice to "shield" electronic devices from external EMI. Metals are extremely effective shielding materials for EMI. Thus, it is known to protect electronic devices by placing a metal shield between the device and the external EMI source. This metal shield ranges in thickness from a foil to a load bearing metal sheet.

It is often desirable from a design and economic standpoint to combine the EMI shielding function with structural or other functions. For example, if the EMI shield can be incorporated into other necessary parts of the article containing the electronic device, it is often possible to reduce the overall cost of the article by eliminating a part. While metal shields can often be used to combine functions in this manner, often the use of metal parts has decided disadvantages. Where weight is a factor, metal parts are often too heavy. Furthermore, metals cannot be molded into highly convoluted shapes. When a lightweight or highly complex shaped part is desired, it is therefore preferable to use a plastic material.

It has previously been attempted to provide resinous materials having EMI shielding properties. For example, it has been attempted to coat by painting, vapor deposition, electroless deposition and other techniques, a thin metallic layer onto a resinous substrate. While good EMI shielding can be obtained in this manner, the coated surface is often subject to scratches, imperfections, marring, denting, etc. which opens "windows" to EMI. Environmental weathering and surface oxidation also adversely affect the metal layer. In addition, the coated surface often cannot be molded or shaped without destroying the integrity of the coating. Therefore, the resinous material must usually be preshaped in one step and subsequently coated in a separate step.

It has also been attempted to place a conductive material inside a resinous part to form an EMI shield. Such conductive composites generally comprise a thermosetting or thermoplastic matrix containing carbon black and/or aluminum flakes as a conductive material. While adequate shielding is often obtained with such composites, high loading of the conductive material (i.e., carbon black or aluminum flakes) is required to achieve the desired shielding. Moreover, these composites exhibit poor surface characteristics and are not highly formable (i.e., can be formed only at low extension ratios). In addition such composites generally are of high density and exhibit relatively low strength-to-weight ratios. Due to the high filler content of such composite, molding equipment used to process these composites exhibit excessive wear due to the high viscosity and metallic nature of the highly filled composite.

Recently, metal fibers, metallized glass fibers, graphite and metallized graphite fibers have been proposed for use in composite EMI shielding materials. However, in the bulk molding or injection molding applications in which such composites are employed, breaking of the fibers greatly reduces the efficiency of the shielding. Accordingly, continuous metal or metallized glass fibers are employed to minimize the effect of the breaking, or it is necessary to conduct the molding operation under careful conditions in order to minimize such breaking. In either case, such composites did not provide an inexpensive means for providing an effective EMI shielding material. Moreover, due to the use of long fibers and thermosetting resins, such composites were not readily moldable as are thermoplastic resins. Due to the breakage of fibers in this composite, a content of metal or metallized glass fibers of 25 percent by weight of the composite or more was generally required to provide effective EMI shielding. Since metal fibers and metallized glass fibers do not provide substantial reinforcement to the composite, it is generally necessary to add additional reinforcing fibers to obtain the desired physical properties. The resulting composite is a highly dense material having poor moldability.

It is also often possible to provide a resin sheet which is electrically conductive. Such electrically conductive sheets would be capable of dissipating static electricity, thereby making them useful in preventing instantaneous discharge of built-up static electricity. Also, by dissipating static electricity, it is possible to reduce or eliminate electrostatic dust build-up on the sheet. Unfortunately, the presently available conductive resin sheets have the same types of deficiencies described for the EMI sield materials.

It is further desirable to provide a resin which is capable of converting radiation energy to heat, in which the disadvantages of previously known microwave absorbers are minimized or overcome.

Accordingly, it would be desirable to provide a resinous composite which is useful as an EMI shielding material, a conductive polymer sheet and/or a microwave absorber, and which is readily formable, has high strength, is of moderate density and is relatively inexpensive.

SUMMARY OF THE INVENTION

The present invention is a resinous composite material which is useful as an EMI shield, conductive polymer, a microwave absorber, and/or like applications. This invention is a resinous composite sheet comprising a continuous matrix of a polymeric resin. Randomly dispersed within said matrix, is from about 0.05 to 30 percent of a finely particulate semi-conductive or conductive filler material and from about 1 to 45 percent of conductive fibers having an aspect ratio (length-to-diameter ratio) of at least about 25. Said fibers are randomly oriented within the matrix in two dimensions substantially in the plane defined by the sheet. The aforementioned percentages are based on the weight of said composite sheet.

Despite the relatively low amounts of conductive fibers and conductive or semi-conductive filler material, the sheet of this invention provides surprisingly high EMI shielding. A shielding effectiveness of 30 to 45 decibels is easily obtainable with the sheet of this invention. In some cases, even higher shieldings (i.e., up to 60 decibels or higher) can be obtained. Furthermore, the effectiveness of the shielding afforded by this sheet material is not significantly adversely effected by molding, shaping or otherwise forming the sheet material into complex shapes. During such forming process, the dispersed fibers flow with the polymer so that the dispersed fibers are homogeneously distributed throughout the shaped article. Thus, the sheet of this invention is readily formed into complexly shaped articles without the need to subsequently coat or otherwise treat the shaped sheet to impart EMI shielding properties thereto. The presence of the fibers often improves the physical properties (i.e. tensile strength) of the EMI shield. In addition, the sheet of this invention solves the long-standing problem of the uneven distribution of the conductive fibers or fillers throughout the sheet material. With the sheet of this invention, the shielding material is distributed evenly throughout the entire part, even at the edges.

DETAILED DESCRIPTION OF THE INVENTION

The resinous composite of this invention comprises a sheet of a continuous resin matrix into which is randomly dispersed a small quantity of a particulate, conductive or semi-conductive filler and randomly oriented conductive fibers.

The resin used herein can be any thermoplastic or thermosetting resin which is solid at ambient temperatures and into which the particulate filler and/or conductive fibers can be incorporated.

Due to the preferred method in which the resinous composite is prepared, it is generally preferable that the resin be water-insoluble and capable of being prepared as or formed into a fine particulate. In general, it is preferable that the resin used as a starting material herein have an average particle size in the range from 0.1 to 400 μm, preferably 50 to 200 μm.

Suitable thermoplastic resins include, for example, polyolefins such as polyethylene; ultra high molecular weight polyethylene; high density polyethylene; linear low density polyethylene; polypropylene and the like; chlorinated polyethylene; polycarbonates; ethylene acrylic acid copolymers; polyamides such as nylon 6, nylon 6,6 and the like; phenylene oxide resins; phenylene sulfide resins; polyoxymethylenes; polyesters; the so-called ABS (acrylonitrile, butadiene, styrene) resins; polyvinyl chloride; vinylidene chloride/vinyl chloride resins; acrylic resins such as polymers and copolymers of alkyl esters of acrylic and methacrylic acid; and vinyl aromatic resins such as polystyrene, poly(vinylnaphthalene), poly(vinyltoluene) and the like.

Thermosetting resins useful herein include epoxy resins, vinyl ester resins, phenol-formaldehyde resins and the like.

Although any of these resins are suitable herein, the particular choice of resin may depend somewhat on the particular requirements of the application for which the resinous composite is to be used. For example, properties such as impact resistance, tensile strength, heat distortion temperature, barrier characteristics and the like are all effected by the choice of polymer. It is generally preferable to use a thermoplastic resin, due to greater ease in preparing and molding the composite. For most applications, polyolefins, vinyl aromatic resins, vinylidene chloride and vinyl chloride copolymers are preferred due to the relatively low cost and generally good properties.

The resin forms a continuous matrix in the resinous composite of this invention into which the other components are dispersed. The particulate filler and the conductive fibers are randomly dispersed into said continuous matrix as further described hereinafter.

The conductive fibers employed herein can be of various compositions. Metal fibers, such as aluminum, nickel, copper, iron and steel fibers are useful as the conductive fiber. Carbon and graphite fibers are also sufficiently conductive for use herein. Diverse metal-coated fibers are suitable for use herein, including metallized glass, metallized graphite and metallized plastic fibers. Mixtures of the foregoing fibers are, of course, also useful herein. Of particular interest are mixtures of carbon or graphite and nickel-coated graphite fibers.

The conductive fiber employed herein has an aspect ratio (length to diameter) of at least about 25, preferably at least about 80, more preferably about 100 to 2000. Advantageously, the conductive fiber has an average length of the order 3/32 to 1 inch (2.4 to 25 mm), preferably from about ¼ to ½ inch (6 to 12.5 mm). Correspondingly, the conductive fiber advantageously has a diameter from about 0.1 to about 2 mils (2.5 to 50 microns), preferably from about 0.2 to about 1.5 mil (5 to 37.5 microns), more preferably from about 0.3 to 1.0 mil (7 to 25 microns).

When a metallized fiber, such as metallized glass, graphite or plastic fiber, is used herein, the fiber contains a metal coating which advantageously covers at least 30 percent, preferably at least 60 percent, more preferably at least 90 percent of the surface of the fiber. Most preferably, the metal coating forms an essentially continuous coating on the surface of the fiber. Advantageously, the metal coating has a thickness from about 0.05 to 5 mil (1.25 to 125 microns), preferably 0.5 to 2 mil (12.5 to 50 microns) thick.

When a metallized plastic fiber is employed, it is essential that the plastic portion of said metallized fiber be one with a significantly higher softening temperature than the resin which forms the continuous matrix of this composite so the composite can be dried, molded, etc. above its softening temperature without melting the metallized fibers.

A wide variety of metals can be used as the coating of a metallized fiber. Generally, however, more highly conductive metals, as well as those of moderate price, are preferred. Thus, although precious metals such as silver, gold or platinum may be used herein, it is preferred, on the basis of cost, to employ less expensive metals such as copper, steel, iron, or especially nickel and aluminum.

Commercially available metallized glass fibers include Metafil® G, from M. B. Associates, and RoMHOglas® available from Lundy Electronics. A commercially available nickel-coated graphite fiber is Cycom®, available from American Cyanamid.

The conductive fibers are dispersed in the resin matrix such that they lie substantially in the plane defined by the composite sheet and are randomly oriented in two dimensions within said plane. The conductive fiber advantageously comprises from about 1 to 45 percent by weight of the EMI shield of this invention. Preferably, said fibers comprise from about 2 to 20 percent, more preferably about 3-12 percent, most preferably from about 5-10 percent of the composite of this invention.

A third critical component of the resinous composite of this invention is a finely particulate conductive or semi-conductive filler material. This filler material is characterized in being of small particle size and non-fibrillar. Semi-conductive materials are well-known and are defined as those materials which are intermediate in conductivity or resistivity between conductors such as metals and non-conductors. Typically, semi-conductors have a resistivity of about $10^{-2}$ to $10^9$ ohms per centimeter. "Conductive" materials generally have a resistivity of less than $10^{-2}$ ohms per centimeter.

Exemplary such semi-conductive filler materials include silicon, silicon dioxide, germanium, selenium, and carbon black. Of these, carbon black is preferred. Of particular interest are the so-called "conductive" carbon blacks which are finely particulate, highly porous, highly structured, very high surface area carbon blacks which have low volatile content (chemiabsorbed oxygen complexes) on the surface of the particles. Furnace blacks, as opposed to chemical blacks, are preferred herein. Exemplary such conductive carbon blacks include Vulcan® XC-72, Vulcan 3C and Vulcan C, available from Cabot Corporation, and Ketjenblack®, available from Akzochemie. Most preferred are Ketjenblack and Black Pearls 2000®, manufactured by Cabot Corporation. Suitable conductive particulate fillers include metallic flakes and powder, milled or ground metallized glass, graphite or plastic fibers and the like. Combinations of the diverse particulate fillers may also be employed.

The particulate filler can be incorporated into the EMI shield of this invention in any convenient manner such as by milling or blending. If desired, a "concentrate" comprising a particulate polymer containing a somewhat higher amount of the conductive or semi-conductive filler, i.e., about 3 to 50 percent by weight filler, may be blended into the resins employed in preparing the EMI shield in an amount sufficient to provide the desired amount of particulate filler.

The conductive or semi-conductive particulate filler comprises from about 0.05 to about 30, preferably 0.1 to about 10, more preferably about 0.1-5, most preferably from about 0.1 to about 3 weight percent of the composite of this invention. The particulate filler material is dispersed as uniformly as possible throughout the resin matrix.

Various optional components are also advantageously employed in the resinous composite of this invention. In the preferred method for making the resinous composite, it is generally necessary to employ a polymeric binder. Accordingly, the resulting resinous composite made using this process generally contains said polymeric binder. Suitable binders include polymeric latexes of substantially water-insoluble organic polymers having bound anionic or cationic charges such as acrylic or styrene/butadiene polymers containing bound sulfonium, sulfoxonium, isothiouronium, pyridinium, quaternary ammonium, sulfate or sulfonate groups. Latex binders which are suitable for use in said preferred method are described in greater detail in U.S. Pat. No. 4,426,470, which is hereby incorporated by reference.

In addition, starch, particularly starch which contains linear polymers such as natural starch or corn starch as well as enzymatically or chemically modified starch and especially starch modified to contain bound cationic charges are suitable as a binder in said preferred method, and the resinous composite of this invention can contain said starch in the resin matrix. When present, the binder generally comprises from about 1 to 10 weight percent of the resinous composite.

In addition, said preferred process generally requires the use of an organic flocculant. Accordingly, the resinous composite of this invention prepared by said process generally further comprises the solids of said flocculant. Suitable flocculants include aluminum polychloride (aluminum hydroxychloride) or diverse organic flocculants such as partially hydrolyzed polyacrylamide, modified cationic polyacrylamide, and diallydiethylammonium chloride. Said flocculant is typically present in relatively small amounts (i.e., less than about 5, preferably less than 3 percent by weight of the resinous composite of this invention).

The resinous composite of this invention may also optionally contain minor amounts of a filler such as silicon dioxide, calcium carbonate, magnesium oxide, calcium silicate and mica. Pigments or dyes may also be added to impart opacity and/or color. Various chemical additives such as anti-oxidants, fire retardants, internal mold release agents, flow control agents, plasticizers, blowing agents, UV stabilizers, thickeners, foaming agents, anti-foaming agents, bacteriocide and the like may also be used for their art-recognized purposes.

In addition, non-conductive fibers may be incorporated into the resinous composite of this invention as a reinforcing agent. The use of such fibers to reinforce plastics is well-known. Said non-conductive fibers may be in the form of short fibers or strands or, less preferably in the form of rovings. Generally, the amount of non-conductive glass fibers is chosen such that the amount of fibers, conductive and nonconductive does not exceed about 70, more preferably about 50 percent by weight of the resinous composite of this invention. A preferred range for the non-conductive reinforcing fiber, in view of the foregoing limitations, is from about 5 to about 30 percent based on the weight of the composite. Surprisingly, it has been found that the presence of non-conductive fibers also tends to increase the EMI shielding effectiveness of the resinous composite.

Suitable non-conductive fibers include, for example, glass fibers, polyester fibers, polybenzimide fibers, polybenzoxazol fibers, polybenzthiazol fibers, and the like.

The resinous composite of this invention is advantageously prepared in a papermaking process as described in U.S. Pat. No. 4,426,470 and in European Patent Publication 81/00268. In such process, a dilute aqueous slurry of finely divided resin particles, conductive fibers, particulate semi-conductive or conductive filler material and binder (and optionally other fillers and non-conductive fibers) is prepared. This slurry is then flocculated with a flocculating agent and partially dewatered causing the flocculated solids to form into a sheet or web. The formed sheet or web can then be dewatered and dried as by air drying at ambient conditions or oven drying. The sheet or web may then be densified by the application of heat and pressure. The resulting sheet is advantageously from about 2 to about 100 mils thick. Advantageously, several of said sheets may be thermowelded together by the application of heat and pressure to form a thicker, stronger resinous composite. Preferably, sufficient layers of said sheets are used so that the resulting resinous composite has a thickness of from about 10 to 250, preferably 25 to 200 mils.

Less preferred methods of incorporating the conductive fibers and particulate fillers into resins include the diverse known corporating techniques. For example, one can, by use of a screw feeder or like equipment, combine the fibers into molten thermoplastic resins. However, such technique is generally unsuitable for friable fibers, such as metallized glass fibers, since the shearing conditions are too great for the fiber to withstand. However, such technique is suitable if less friable fibers, such as metal or metallized thermoplastic fibers are used, and care is taken to minimize shear during the mixing process.

If desired, the resinous composite of this invention can be chopped into segments of relatively small dimensions, such as about ⅛ to 1 inch (3–25 mm) squares which can be used as a feed for an injection molding process. By operating said injection molding process under conditions of minimum shear, it is possible to prepare an injection molded resinous composite within the scope of this invention. When said composite is injection molded, it is desirable to employ those fibers which are less friable, such as metal, graphite, metallized graphite or metallized plastic fibers.

The resinous composite of this invention often provides substantial EMI shielding. When the composite is to be used for EMI shielding, it advantageously exhibits an EMI shielding effectiveness of at least 30, preferably at least 40 decibels. Shielding efficiencies of 30 to 40 decibels are adequate for a large majority of applications. Greater shielding effectiveness, up to 60–80 decibels, or greater, can also be achieved with this invention. The shielding effectiveness of the resinous composite of this invention is quite surprising considering the relatively low levels of conductive fibers and particulate fillers employed. By comparison, it is generally necessary to use up to 40 percent by weight or more of conductive materials in conventional EMI shield to obtain comparable shielding characteristics.

The resinous composite can be molded by any suitable technique into a desired shape for use. A significant advantage to this resinous composite is its ability to be shaped into a part which performs structural as well as shielding functions. In particular, the composite of this invention can be formed into complex shapes as may be required for use, for example, as an appliance cabinet base or housing. In addition, the resinous composite of this invention is not especially susceptible to scratches, dents, mars, environmental weathering, surface oxidation and the like and therefore can be used as a protective covering as well as an EMI shield. Also because of its strength, the resinous composite of this invention can also be used as a base or panel on which various components can be attached.

In general, the resinous composite of this invention is placed between the electronic parts to be protected and the offending electromagnetic interference. Preferably, the resinous composite of this invention will essentially completely enclose or be combined with other shielding materials to essentially completely enclose the electronic components to be protected.

The resinous composite has further properties which render it useful in other applications. Because of the conductive fibers, the resinous composite is capable of dissipating electrostatic charges. In the electronics industry, the instantaneous discharge of static electrical charges, or the build-up of such static charges itself can severely damage electronic components. The composite of this invention can be employed to dissipate such static electricity, thereby preventing instantaneous discharge or excessive static build-up. Often, the sheet is sufficiently conductive that it may be coated by electrodeposition, electrostatic spraying, or similar techniques.

In addition, the resinous composition is an absorber of microwaves and/or radiofrequency radiation, turning this energy into heat. This property permits its use, for example, as a browning dish for microwave cooking.

A further advantage of this composite is that, due to its ability to dissipate static electricity, it does not tend to electrostatically attract dust particles.

The following examples are provided to illustrate the invention but are not intended to limit the scope thereof. All parts and percentages are by weight unless otherwise indicated.

EXAMPLE 1

Composite Sample No. 1-A is prepared according to the following general procedure. Into a vessel containing 28 liters of thickened water (viscosity of about 50 centipoises) are dispersed 46.2 g of aluminum coated glass fibers, 18 microns in diameter and ½ inch long (available from Lundy Electronics) and 46.2 g of 3/16 inch chopped strand glass fibers (415BB available from Owens Corning Fiberglas). The resulting slurry is stirred under high shear for about 5 minutes. Continuing the stirring, 169.4 g of a high density polyethylene powder (prepared generally according to the process of U.S. Pat. No. 4,323,531), 3 g of Ketjenblack conductive carbon black and 9.8 g (solids) of a 54/45/1 styrene/butadiene/fumaric acid latex are added. The mixture is then stirred for another 2 minutes. Then, 150 g of a 0.2 percent solid aqueous solution of Betz ®1260 flocculant (available from Betz Laboratories) are added slowly to the stirred slurry. The slurry is then stirred for about 1 minute and 14 liters is poured into the headbox of a M/K sheet former (available from M/K Systems, Inc., Lynn, Mass.) (12 inches ×12 inches) containing 14 liters of water. The slurry is mildly agitated and dewatered. The solids are collected on a 80 mesh screen, wet pressed and dried in a forced air oven at a 105° C. for 90 minutes. The sheet thus produced is pressed in a steam heating press at 700 psi and 165° C. to form a densified composite. The composite is then tested for shielding effectiveness using a shielded method at 1000 MH$_z$ (1GH$_z$). The shielding effectiveness for this composite is as reported in Table I following.

Example 1-B is prepared in like manner, this time using 23.1 g of metallized glass and 69.3 g of non-metallized glass. This sheet is also evaluated for shielding effectiveness with the result as reported in Table I following.

For comparison, Comparative Sample Nos. C-1 to C-4 are prepared according to the foregoing general process. Sample No. C-1 contains no metallized glass fibers, 92.4 g of non-metallized glass fibers and no carbon black. Sample No. C-2 contains 23.1 g of metallized glass fibers, 69.3 g of non-metallized glass fibers and no carbon black. Sample No. C-3 contains 46.2 g of metallized glass fibers, 46.2 g of non-metallized glass fibers and no carbon black. Sample No. C-4 contains 3 percent carbon black, no metallized glass fibers and 92.4 g of non-metallized glass fibers. These comparative samples are evaluated for shielding effectiveness with the result as indicated in Table I following.

TABLE I

| Sample No[1] | Metallized Glass (wt. %) | Nonmetallized Glass (wt. %) | Carbon Black (wt. %) | Shielding[2] Effectiveness (dB) |
| --- | --- | --- | --- | --- |
| 1-A | 16.5 | 16.5 | 1.1 | 52 |
| 1-B | 8.25 | 24.75 | 1.1 | 44 |
| C-1* | 0 | 33 | 0 | 2 |
| C-2* | 8.25 | 24.75 | 0 | 26 |
| C-3* | 16.5 | 16.5 | 0 | 38 |
| C-4* | 0 | 33 | 1.1 | 8 |

*Not an example of this invention.
[1] All samples contain 169.4 g high density polyethylene, 9.8 g solids of a 54/45/1 styrene/butadiene/fumaric acid latex and 0.3 g flocculant solids.
[2] Shielding effectiveness measured in decibels. Each 10 decibels in shielding effectivenes corresponds to a 90 percent reduction in EMI. Thus, a 30 decibel shield screens 99.9 percent of the EMI. A 50 decibel shield screens 99.999 percent of the EMI and so on.

In the foregoing example, Comparative Sample No. C-1 can be used as a base line. It is seen that the polymeric shield without carbon black or metallized glass has a shielding effectiveness of 2 decibels. By adding carbon black, as in Comparative Sample No. C-4, the shielding effectiveness is increased by 6 decibels to a total of 8 decibels. In Comparative Sample No. C-2, the presence of 8.25 weight percent of metallized glass fibers increases the shielding effectiveness to 26 decibels. Comparing Comparative Sample No. C-2 wi Sample 1-B, it is seen that the use of 8.25 weight percent of metallized glass fibers with 3 g of carbon black provides a shielding effectiveness of 44 decibels, which is 18 decibels greater than that Comparative Sample No. C-2. Only 6 decibels of this difference can be accounted for by the addition of the carbon black into Sample No. 1-B. Thus, comparing Sample 1-B and Comparative Sample No. C-2, the surprisingly beneficial effect of employing the conductive fibers in conjunction with small amounts of carbon back is readily seen.

Similar observations are made in comparing Sample No. 1-A with Comparative Sample No. C-3. Both contain the same amount of metallized glass. However, Sample 1-A contains in addition 3 g of carbon black. This shielding effectiveness of Sample 1-A is 14 decibels greater than that of Comparative Sample No. C-3. Again only 6 decibels of this accounted for by the presence of carbon black in Sample No. 1-A. The remaining improvement is due to the unexpected interaction between the carbon black and conductive fibers in Sample No. 1-A.

EXAMPLE 2

Using the general procedure described in Example 1, composite Samples 2-A, 2-B and 2-C are prepared containing 8.25 weight percent metallized glass fibers and 0.1, 0.5 and 1.0 weight percent, respectively, of Vulcan XC-72 conductive carbon black. Each sample also contains 24.75 weight percent of non-metallized glass fibers. The shielding effectiveness of each sample is measured and is as reported in Table II following.

TABLE II

| Sample No[1] | Metallized Glass (wt. %) | Nonmetallized Glass (wt. %) | Carbon Black (wt. %) | Shielding[2] Effectiveness (dB) |
| --- | --- | --- | --- | --- |
| 2-A | 8.25 | 24.75 | 0.1 | 47 |
| 2-B | 8.25 | 24.75 | 0.5 | 46 |
| 2-C | 8.25 | 24.75 | 1.0 | 44 |

[1] All samples contain 169.4 g high density polyethylene, 9.8 g solids of a 54/45/1 styrene/butadiene/fumaric acid latex and 0.3 g flocculant solids.
[2] Shielding effectiveness measured in decibels. Each 10 decibels in shielding effectiveness corresponds to a 90 percent reduction in EMI. Thus, a 30 decibel shield screens 99.9 percent of the EMI. A 50 decibel shield screens 99.999 percent of the EMI and so on.

As can be seen from the results in Table II, even very low levels of carbon black in the shielding material provides the shielding material with excellent shielding properties. The differences in the shielding effectiveness values is within experimental error.

EXAMPLE 3

Using the general procedure described in Example 1, composite Samples Nos. 3-A through 3-G are prepared. Each contains 7.0 weight percent of metallized glass fibers as described in Example 1 and 26.0 weight percent of non-metallized glass fibers. The amount of carbon black (Vulcan XC-72) is varied in each sample, as is shown in Table III following. The resin used is Styron ® 6075, a commercially available polystyrene. Each of Sample Nos. 3-A through 3-G are evaluated for shielding effectiveness with the results as reported in Table III following.

TABLE III

| Sample No[1] | Metallized Glass (wt. %) | Nonmetallized Glass (wt. %) | Carbon Black (wt. %) | Shielding[2] Effectiveness (dB) |
| --- | --- | --- | --- | --- |
| 3-A | 7.0 | 26.0 | 0.1 | 24 |
| 3-B | 7.0 | 26.0 | 0.2 | 31 |
| 3-C | 7.0 | 26.0 | 0.3 | 35 |
| 3-D | 7.0 | 26.0 | 0.5 | 35 |
| 3-E | 7.0 | 26.0 | 0.6 | 32 |
| 3-F | 7.0 | 26.0 | 1.1 | 33 |
| 3-G | 7.0 | 26.0 | 2.1 | 38 |

[1] All samples contain 169.4 g Styron ® 6075 polystyrene, 9.8 g solids of a 54/45/1 styrene/butadiene/fumaric acid latex and 0.3 g flocculant solids. Samples are molded at 700 psi and 190° C.
[2] Shielding effectiveness measured in decibels. Each 10 decibels in shielding effectiveness corresponds to a 90 percent reduction in EMI. Thus, a 30 decibel shield screens 99.9 percent of the EMI. A 50 decibel shield screens 99.999 percent of the EMI and so on.

Again, it is seen that very good EMI shielding is obtained using very low levels of both conductive fibers and carbon black. The shielding effectiveness is not particularly sensitive to the amount of carbon black. Accordingly, very low levels of carbon black are effective in providing desirable shielding effectiveness to the shield of this invention.

What is claimed is:

1. A resinous composite sheet comprising (a) a continuous matrix of a polymeric resin, having randomly dispersed therein (b) from about 0.05 to about 30 percent by weight of the composite of a finely particulate conductive or semi-conductive filler material and (c) from about 1 to 45 percent by weight of the composite of conductive fibers selected from the group consisting of metal, carbon and graphite fibers having an aspect ratio of at least about 25, which conductive fibers are randomly oriented in two dimensions substantially in the plane defined by said sheet.

2. The resinous composite of claim 1 wherein said conductive fibers have an average length of about 2.4 to 25 mm.

3. The resinous composite of claim 1 wherein said conductive fibers have a diameter from about 0.1 to 2 mils.

4. The resinous composite of claim 1 wherein said sheet has an EMI shielding effectiveness of at least 30 decibels.

5. The resinous composite of claim 4 wherein said filler material is conductive carbon back.

6. The resinous composite of claim 1 wherein the composite sheet comprises from about 5 to 10 percent of the conductive fibers and 0.1 to 3 percent carbon black based on the weight of the composite.

7. The resinous composite of claim 1 further comprises from about 5 to 30 percent of a non-conductive reinforcing fiber based on the weight of the composite.

8. The resinous composite of claim 7 wherein said non-conductive reinforcing fiber is fiberglass.

9. The resinous composite of claim 1 which absorbs microwave radiation.

10. The resinous composite of claim 1 which dissipates static electricity.

11. The resinous composite of claim 4 wherein said filler material is conductive carbon black and said conductive fibers comprise a mixture of carbon and/or graphite fibers.

* * * * *